US009484810B2

(12) United States Patent
Teraguchi

(10) Patent No.: US 9,484,810 B2
(45) Date of Patent: Nov. 1, 2016

(54) SEMICONDUCTOR DEVICE AND METHOD OF MANUFACTURING THE SAME

(71) Applicant: KABUSHIKI KAISHA TOSHIBA, Tokyo (JP)

(72) Inventor: Takayuki Teraguchi, Kanagawa (JP)

(73) Assignee: KABUSHIKI KAISHA TOSHIBA, Tokyo (JP)

(*) Notice: Subject to any disclaimer, the term of this patent is extended or adjusted under 35 U.S.C. 154(b) by 249 days.

(21) Appl. No.: 14/176,441

(22) Filed: Feb. 10, 2014

(65) Prior Publication Data

US 2015/0048809 A1 Feb. 19, 2015

(30) Foreign Application Priority Data

Aug. 13, 2013 (JP) ................................ 2013-168169

(51) Int. Cl.
*H02M 3/07* (2006.01)
*H03K 3/03* (2006.01)

(52) U.S. Cl.
CPC ........... *H02M 3/073* (2013.01); *H03K 3/0315* (2013.01); *H02M 2003/071* (2013.01); *H02M 2003/072* (2013.01); *H02M 2003/076* (2013.01)

(58) Field of Classification Search
CPC ............... H02M 3/073; H02M 3/071; H02M 2003/076; H02M 2003/072; H03K 3/0315
USPC .................................................. 323/271, 282
See application file for complete search history.

(56) References Cited

U.S. PATENT DOCUMENTS

| 6,188,590 | B1 * | 2/2001 | Chang | H02M 3/073 363/60 |
| 8,289,072 | B2 | 10/2012 | Seshita | |
| 8,390,339 | B2 | 3/2013 | Seshita | |
| 8,896,367 | B1 * | 11/2014 | Lin | H02M 3/073 327/536 |
| 2003/0218453 | A1 * | 11/2003 | Castaldo | H02M 3/073 323/283 |

(Continued)

FOREIGN PATENT DOCUMENTS

| CN | 101048930 A | 10/2007 |
| JP | 2003-168963 A | 6/2003 |

(Continued)

OTHER PUBLICATIONS

Japanese Office Action dated Nov. 10, 2015, filed in Japanese counterpart Application No. 2013-168169, 8 pages (with translation).

(Continued)

*Primary Examiner* — Timothy J Dole
*Assistant Examiner* — Sisay G Tiku
(74) *Attorney, Agent, or Firm* — Patterson & Sheridan, LLP

(57) ABSTRACT

A regulator includes a capacitor connected between a ground terminal and an output terminal at which a first voltage is supplied. The first voltage is higher than a power source voltage supplied to the regulator. A feedback circuit in the regulator is configured to output a boost signal corresponding to a comparison between the first voltage and a threshold voltage value. A clock generating circuit includes an oscillator circuit that outputs an oscillation signal and a buffer circuit that outputs a clock signal according to the oscillation signal. The clock signal has an electric current level that is controlled in accordance with the boost signal. A charge pump outputs the first voltage in accordance with the clock signal.

12 Claims, 10 Drawing Sheets

(56) References Cited

U.S. PATENT DOCUMENTS

| | | | |
|---|---|---|---|
| 2005/0062518 A1* | 3/2005 | Seo | H02M 3/073 327/535 |
| 2008/0030261 A1 | 2/2008 | Nakata | |
| 2009/0023415 A1* | 1/2009 | Seshita | H03K 17/04106 455/333 |
| 2009/0167418 A1* | 7/2009 | Raghavan | H02M 3/073 327/536 |
| 2011/0050323 A1* | 3/2011 | Seshita | H03K 17/063 327/427 |
| 2011/0080198 A1* | 4/2011 | Ohta | H02M 3/073 327/157 |
| 2011/0095806 A1* | 4/2011 | Seshita | H03K 17/693 327/333 |
| 2012/0068757 A1 | 3/2012 | Seshita et al. | |
| 2012/0300552 A1* | 11/2012 | Neto | H02M 3/073 365/185.18 |
| 2013/0148456 A1* | 6/2013 | Cho | G11C 5/145 365/226 |

FOREIGN PATENT DOCUMENTS

| | | |
|---|---|---|
| JP | 2004004609 A | 1/2004 |
| JP | 2006136134 A | 5/2006 |
| JP | 2007221890 A | 8/2007 |
| JP | 2010004717 A | 1/2010 |
| JP | 2010246081 A | 10/2010 |
| JP | 2010259155 A | 11/2010 |
| JP | 2012170240 A | 9/2012 |
| WO | 2006049007 A1 | 5/2006 |

OTHER PUBLICATIONS

Chinese Office Action dated May 19, 2016, filed in Chinese counterpart Application No. 2014100430048, 19 pages (with translation).

* cited by examiner

SEMICONDUCTOR DEVICE AND METHOD OF MANUFACTURING THE SAME

CROSS-REFERENCE TO RELATED APPLICATION

This application is based upon and claims the benefit of priority from Japanese Patent Application No. 2013-168169, filed Aug. 13, 2013, the entire contents of which are incorporated herein by reference.

FIELD

Embodiments described herein relate generally to a regulator and a switch device.

BACKGROUND

A voltage step up/down circuit known in the art includes a ring oscillator, a charge pump, and a regulator. According to this type of voltage step up/down circuit, an oscillation signal generated by the ring oscillator is stepped up or down by using the charge pump, and is set to a desired voltage by using the regulator.

The capability of voltage step up and down may be increased by increasing the consumption current of an output buffer contained in the ring oscillator. However, this output buffer allows constant flow of a current even after coming into a steady state, and therefore consumes unnecessary current.

DETAILED DESCRIPTION

In general, according to one embodiment, a regulator and a switch device capable of reducing consumption current are provided.

According to an embodiment, a regulator includes a first capacitor connected between a ground terminal (a terminal at ground potential) and a first output terminal from which a first voltage is supplied. The first voltage is higher than a first power source voltage. A first diode may be connected between the first power source voltage and the first output terminal. The regulator also includes a feedback circuit that is configured to output a first boost signal according to a comparison between the first voltage and a first threshold voltage. The regulator additionally includes a clock generating circuit including an oscillator circuit that is configured to output an oscillation signal and a first buffer circuit that is configured to output a first clock signal according to the oscillation signal. The first clock signal has a current level that varies in accordance with the first boost signal. A charge pump that outputs the first voltage to the first output voltage terminal according to the first clock signal is further provided. As the first clock signal varies, the first voltage will vary therewith.

Embodiments are hereinafter described with reference to the drawings.

First Embodiment

Figure 1:
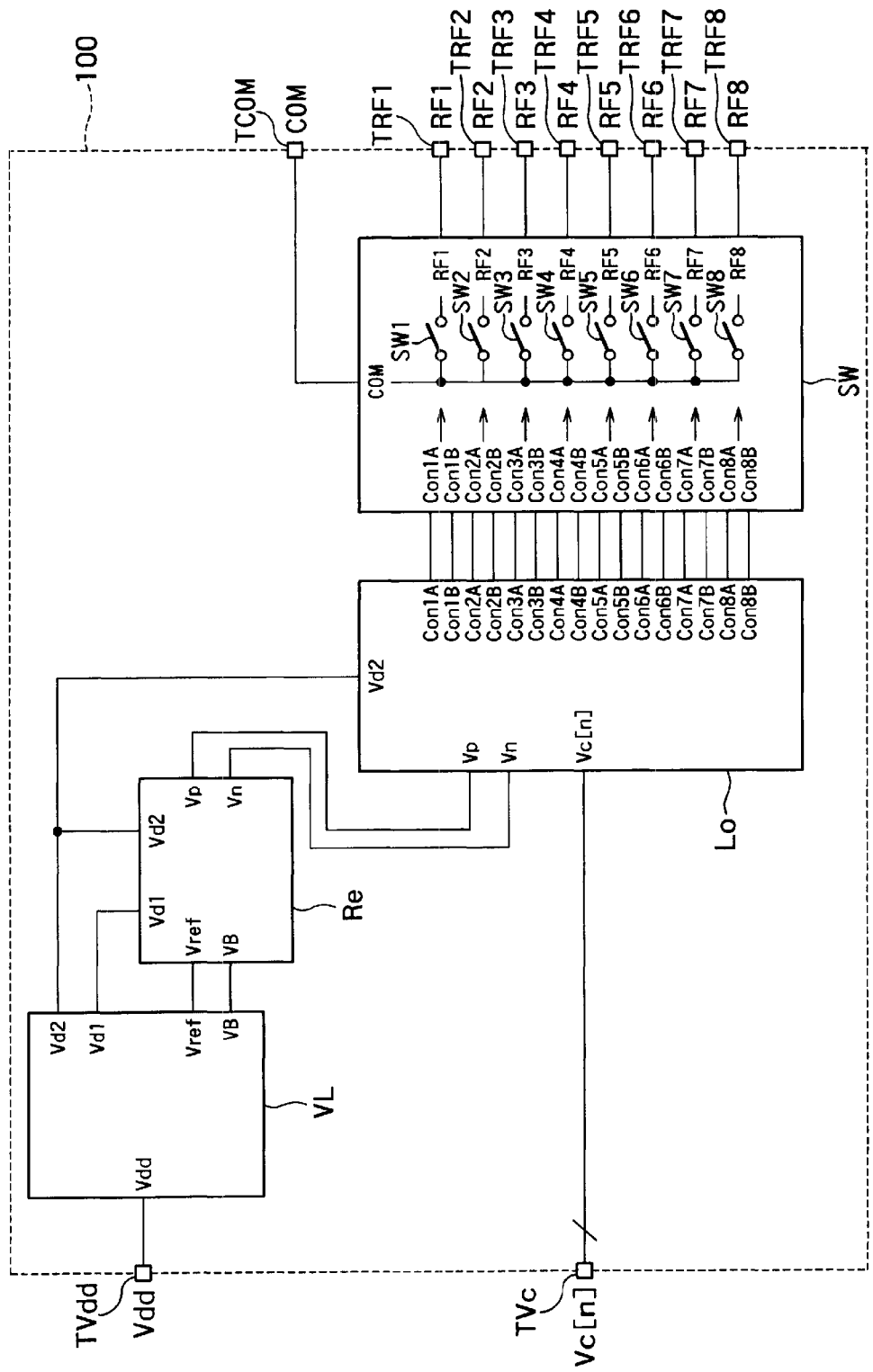
FIG. 1 is a circuit diagram showing a structure example of a switch device according to a first embodiment.

FIG. 1 is a circuit diagram showing an example of a switch device 100 according to a first embodiment.

As shown in FIG. 1, the switch device 100 includes a voltage stabilizer VL, a regulator Re, a decoder Lo, and a switch circuit SW.

The voltage stabilizer VL generates source voltages Vd1 and Vd2, a reference voltage Vref, and a control voltage VB from an external source voltage Vdd supplied via an external power terminal TVdd. The generated voltages are output to the regulator Re. The source voltage Vd2 is also output to the decoder Lo.

The regulator Re outputs a step-up voltage Vp higher than the source voltage Vd1, and a step-down voltage Vn lower than a ground voltage GND.

The decoder Lo decodes an input signal (data signal) Vc[n] inputted via an input terminal TVc, and outputs switch control signals Con1A through Con8B generated from the step-up voltage Vp or the step-down voltage Vn.

The switch circuit SW connects in series between a common terminal TCOM and output terminals TRF1 through TRF8, and includes a plurality of switch elements (e.g., semiconductor switches) SW1 through SW8 which are controlled by the control signals Con1A through Con8B.

The switch device 100 controls the connection between the common terminal TCOM and the output terminals TRF1 through TRF8 to switch between the conductive state and the open state in accordance with the input signal (data signal) Vc[n]. This operation controls signals RF1 through RF8.

Each of the control signals Con1A through Con8B uses a voltage higher than the source voltage Vd1 and a voltage lower than the ground voltage GND. By using a higher voltage than the source voltage Vd1 and a lower voltage than the ground voltage GND, it is possible to improve the switching performance of the switch device 100.

Figure 2:
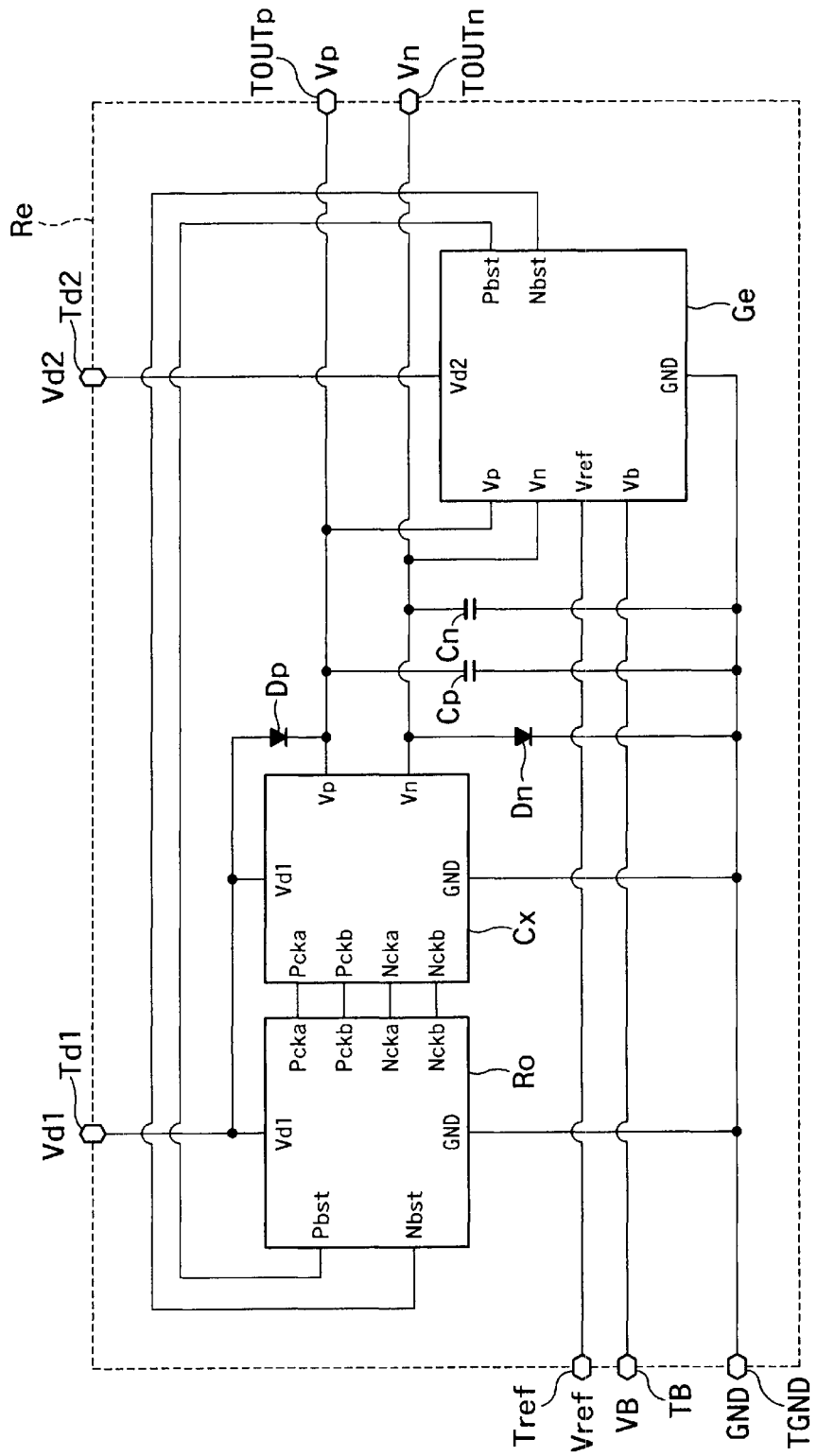
FIG. 2 is a block diagram showing a structure example of a regulator according to the first embodiment.

FIG. 2 is a block diagram showing a structure example of the regulator Re according to the first embodiment shown in FIG. 1.

Figure 3:
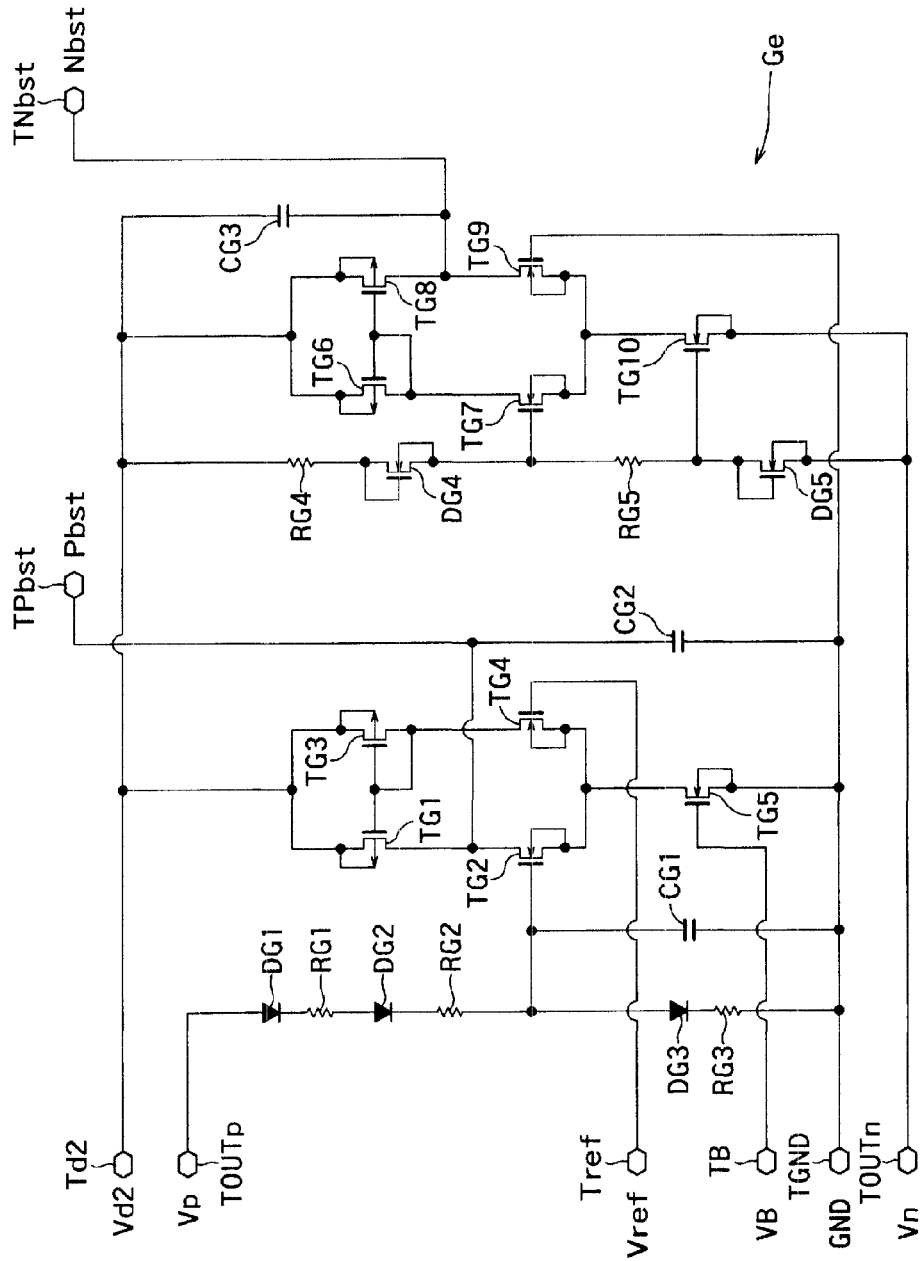
FIG. 3 is a circuit diagram showing a structure example of a feedback circuit shown in FIG. 2.

FIG. 3 is a circuit diagram showing a structure example of a feedback circuit Ge shown in FIG. 2.

Figure 4:
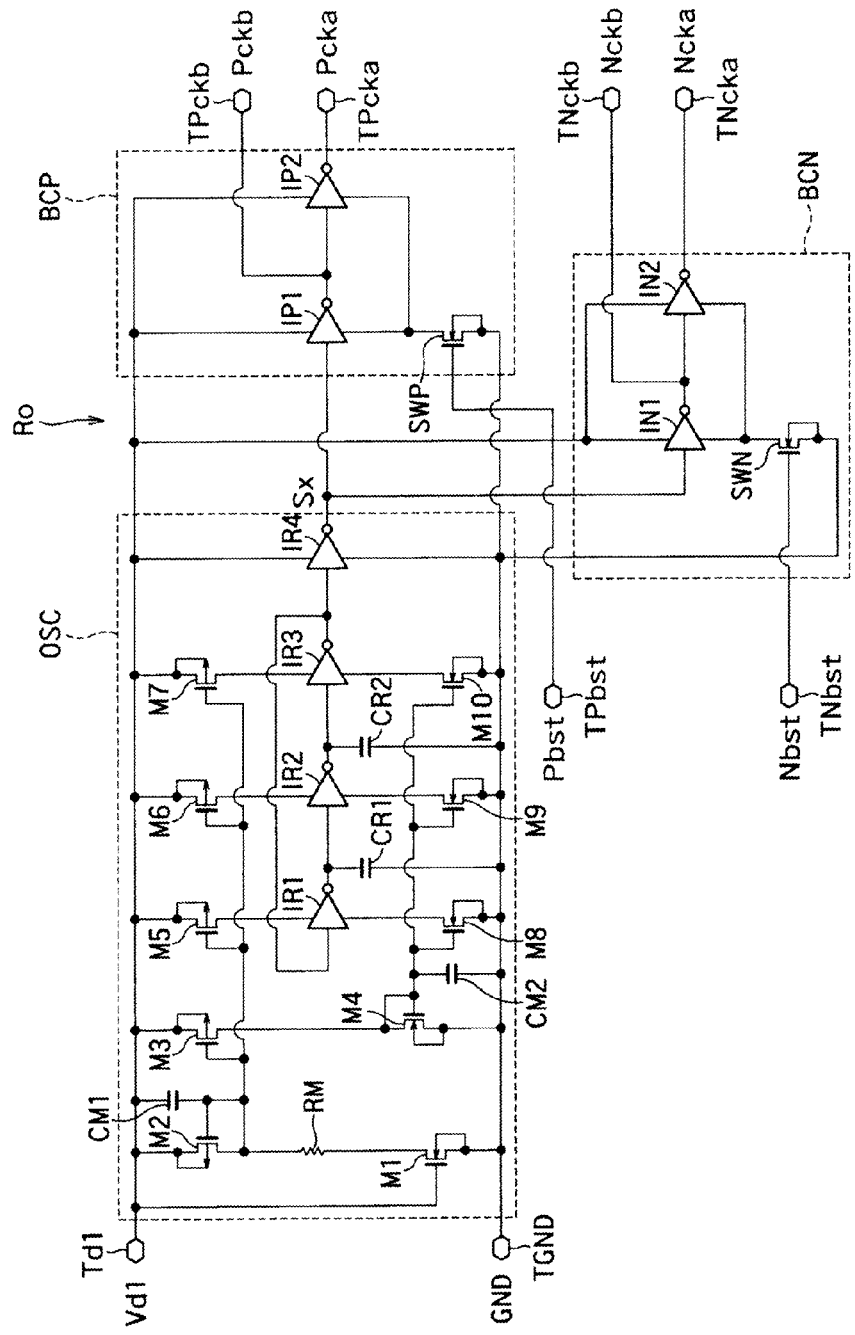
FIG. 4 is a circuit diagram showing a structure example of a clock generating circuit shown in FIG. 2.

FIG. 4 is a circuit diagram showing a structure example of a clock generating circuit Ro shown in FIG. 2.

Figure 5:
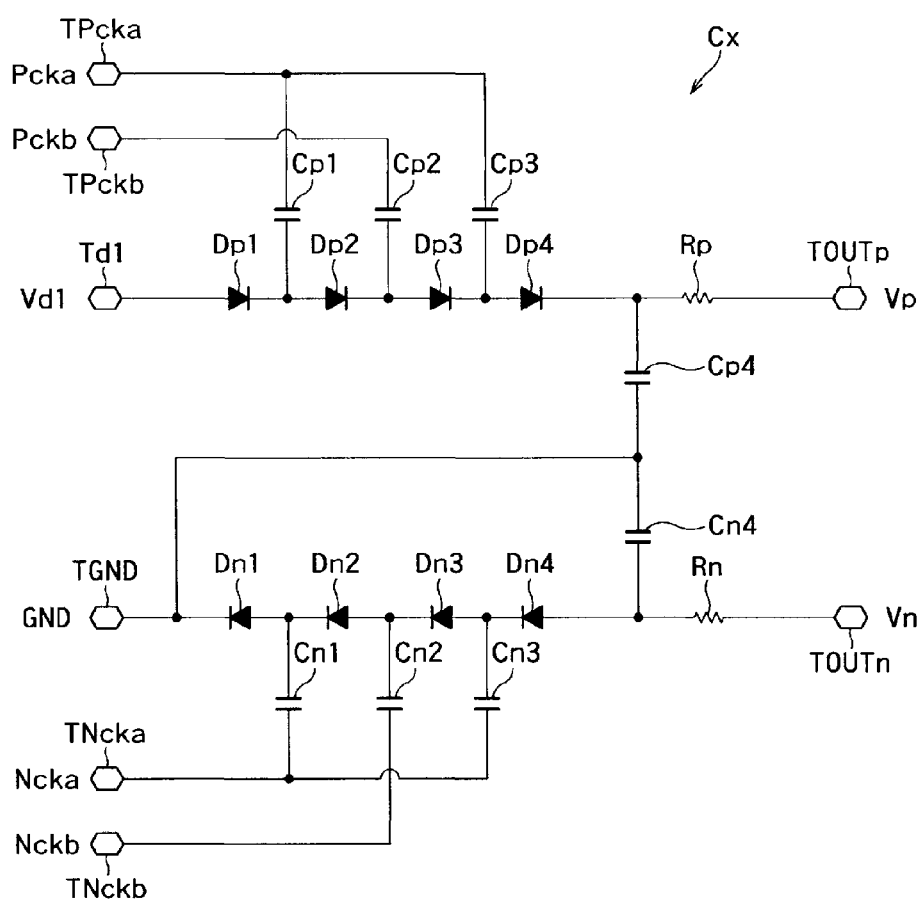
FIG. 5 is a circuit diagram showing a structure example of a charge pump shown in FIG. 2.

FIG. 5 is a circuit diagram showing a structure example of a charge pump Cx shown in FIG. 2.

As shown in FIG. 2, the regulator Re includes a first power terminal (for connection to a power source first voltage) Td1, a second power terminal (for connection to a power source second voltage) Td2, a step-up output terminal (for output of a first regulator voltage) TOUTp, a step-down output terminal (output of a second regulator voltage) TOUTn, a ground terminal (for connection to a ground potential) TGND, a step-up diode Dp, a step-up capacitor Cp, a step-down diode Dn, a step-down capacitor Cn, the feedback circuit Ge, the clock generating circuit Ro, and the charge pump Cx, for example.

The step-up output terminal TOUTp outputs the step-up voltage Vp that is higher than the source voltage Vd1.

The step-down output terminal TOUTn outputs the step-down voltage Vn that is lower than the ground voltage GND.

The power terminal Td1 receives the source voltage Vd1. The power terminal Td2 receives the source voltage Vd2. The ground terminal TGND receives the ground voltage GND.

The anode of the step-up diode Dp connects to the power terminal Td1, while the cathode of the step-up diode Dp connects to the step-up output terminal TOUTp.

The step-up capacitor Cp connects between the step-up output terminal TOUTp and the ground terminal TGND.

The anode of the step-down diode Dn connects to the step-down output terminal TOUTn, while the cathode of the step-down diode Dn connects to the ground terminal TGND.

The step-down capacitor Cn connects between the step-down output terminal TOUTn and the ground terminal TGND.

The feedback circuit Ge outputs a step-up boost signal Pbst in accordance with the result of comparison between the step-up voltage VP and a step-up threshold that is predetermined. The feedback circuit Ge also outputs a step-down boost signal Nbst in accordance with the result of comparison between the step-down voltage Vn and a step-down threshold that is predetermined.

As depicted in FIG. 3, the feedback circuit Ge includes: a voltage dividing circuit which contains diodes DG1 through DG3 and resistors RG1 through RG3 connected in series (in sequence from TOUTp: DG1, RG1, DG2, RG2, DG3, RG3) between the step-up output terminal TOUTp and the ground terminal TGND; a capacitor CG1 connected between the gate of a MOS (metal-oxide-semiconductor) transistor TG2 and the ground terminal TGND; a first comparator formed by MOS transistors TG1 through TG5 and comparing a divided voltage based on the step-up output voltage Vp to the reference voltage Vref from reference voltage terminal Tref and outputting the comparison result to the step-up boost terminal TPbst as the step-up boost signal Pbst; and a capacitor CG2 connected between the step-up boost terminal TPbst and the ground terminal TGND, for example.

According to this structure, the first comparator in feedback circuit Ge in FIG. 3 compares the divided voltage based on the step-up output voltage Vp and the reference voltage Vref of the reference voltage terminal Tref so as to indirectly compare the step-up voltage Vp and the step-up threshold determined beforehand, and outputs the step-up boost signal Pbst corresponding to the result of the comparison.

As shown in FIG. 3, the feedback circuit Ge further includes: a voltage dividing circuit which contains diodes DG4 and DG5 and resistors RG4 and RG5 connected in series (in sequence from the power terminal Td2: RG4, DG4, RG5, DG5) between the step-down output terminal TOUTn and the power terminal Td2; a second comparator formed by MOS transistors TG6 through TG10 that compares a divided voltage based on the step-down output voltage Vn to the ground voltage GND from the ground terminal TGND and outputs the comparison result to the step-down boost terminal TNbst as a step-down boost signal Nbst; and a capacitor CG3 connected between the step-down boost terminal TNbst and the power terminal Td2, for example.

The feedback circuit Ge depicted in FIG. 3 includes a second comparator that compares the divided voltage based on the step-down output voltage Vn and the ground voltage GND so as to indirectly compare the step-down voltage Vn and the predetermined step-down threshold, and then outputs the step-down boost signal Nbst corresponding to the result of the comparison.

The clock generating circuit Ro outputs step-up clock signals Pcka and Pckb to step-up clock terminals TPcka and TPckb, and outputs step-down clock signals Ncka and Nckb to step-down clock terminals TNcka and TNckb.

As shown in FIG. 4, the clock generating circuit Ro includes an oscillator OSC, a step-up buffer circuit BCP, and a step-down buffer circuit BCN, for example.

The oscillator OSC outputs an oscillation signal Sx.

As depicted in FIG. 4, the oscillator OSC includes: a mirror circuit with MOS transistors M1 through M10, a resistor RM, and capacitors CM1 and CM2; inverters IR1 through IR3 receiving supply of a driving current from the mirror circuit and connected in the shape of a ring; and an inverter IR4 of which an input terminal connects with the output of the inverter IR3 and an output terminal outputs the oscillation signal Sx, for example.

The step-up buffer circuit BCP outputs the step-up clock signals Pcka and Pckb to the step-up clock terminals TPcka and TPckb based on the oscillation signal Sx. The step-up buffer circuit BCP changes the output current supplied as the step-up clock signals Pcka and Pckb in accordance with supply of the driving current controlled in accordance with the step-up boost signal Pbst.

As shown in FIG. 4, the step-up buffer circuit BCP includes step-up inverters IP1 and IP2, connected in series, and a step-up control switch SWP, for example.

The step-up inverters IP1 and IP2 receive input of a signal corresponding to the oscillation signal Sx, and outputs the step-up clock signals Pcka and Pckb. The step-up clock signal Pcka is an inversion signal of the step-up clock signal Pckb.

The step-up control switch SWP controls the driving current supplied to the step-up inverters IP1 and IP2 in accordance with the step-up boost signal Pbst. As shown in FIG. 4, the step-up control switch SWP is an MOS transistor controlled by the step-up boost signal Pbst, for example.

When the step-up boost signal Pbst indicates that the level of the step-up voltage Vp is lower than the step-up threshold (that is, at the time of the nominally "High" level), for example, the step-up control switch SWP is turned on and increases the driving current supplied to the step-up inverters IP1 and IP2.

Namely, the current outputted to the step-up clock terminals TPcka and TPckb of the step-up inverters IP1 and IP2 rises in accordance with the step-up boost signal Pbst that indicates that the level of the step-up voltage Vp is lower than the step-up threshold, whereby the driving capability (output current) of the step-up buffer circuit BCP provided for the step-up clock signals Pcka and Pckb rises.

On the other hand, when the step-up boost signal Pbst indicates that the level of the step-up voltage Vp is equal to or higher than the step-up threshold (at the time of "Low" level), the step-up control switch SWP is turned off and decreases the driving current supplied to the step-up inverters IP1 and IP2.

Namely, the current outputted to the step-up clock terminals TPcka and TPckb of the step-up inverters IP1 and IP2 lowers in accordance with the step-up boost signal Pbst that indicates that the level of the step-up voltage Vp is equal to or higher than the step-up threshold, whereby the driving capability (output current) of the step-up buffer circuit BCP provided for the step-up clock signals Pcka and Pckb lowers.

The step-down buffer circuit BCN outputs the step-down clock signals Ncka and Nckb to the step-down clock terminals TNcka and TNckb based on the oscillation signal Sx. The step-down buffer circuit BCN changes the output current provided for the step-down clock signals Ncka and Nckb in accordance with supply of the driving current controlled in accordance with the step-down boost signal Nbst.

As shown in FIG. 4, the step-down buffer circuit BCN includes step-down inverters IN1 and IN2, and a step-down control switch SWN, for example.

The step-down inverters IN1 and IN2 receive input of a signal corresponding to the oscillation signal Sx, and output the step-down clock signals Ncka and Nckb. The step-down clock signal Ncka is an inversion signal of the step-down clock signal Nckb.

The step-down control switch SWN controls the driving current supplied to the step-down inverters IN1 and IN2 in accordance with the step-down boost signal Nbst. The step-down control switch SWN is an MOS transistor controlled by the step-down boost signal Nbst.

When the step-down boost signal Nbst indicates that the level (absolute value) of the step-down voltage Vn is lower than the step-down threshold (at the time of "High" level), for example, the step-down control switch SWN is turned on and increases the driving current supplied to the step-down inverters IN1 and IN2.

Namely, the current outputted to the step-down clock terminals TNcka and TNckb of the step-down inverters IN1 and IN2 rises in accordance with the step-down boost signal Nbst indicating that the level of the step-down voltage Vn is lower than the step-down threshold, whereby the driving capability (output current) of the step-down buffer circuit BCN for the step-down clock signals Ncka and Nckb rises.

On the other hand, when the step-down boost signal Nbst indicates that the level of the step-down voltage Vn is equal to or higher than the step-down threshold (at the time of a nominally "Low" level), the step-down control switch SWN is turned off and decreases the driving current supplied to the step-down inverters IN1 and IN2.

Namely, the current outputted to the step-down clock terminals TNcka and TNckb of the step-down inverters IN1 and IN2 lowers in accordance with the step-down boost signal Nbst indicating that the level of the step-down voltage Vn is equal to or higher than the step-down threshold, whereby the driving capability (output current) of the step-down buffer circuit BCN for the step-down clock signals Ncka and Nckb lowers.

The charge pump Cx outputs the step-up voltage Vp to the step-up output terminal TOUTp in accordance with the step-up clock signals Pcka and Pckb. The charge pump Cx further outputs the step-down voltage Vn to the step-down output terminal TOUTn in accordance with the step-down clock signals Ncka and Nckb (FIG. 2).

As shown in FIG. 5, the charge pump Cx, for example, includes diodes Dp1 through Dp4 and a resistor Rp connected in series (in sequence from power terminal Td1: Dp1, Dp2, Dp3, Dp4, Rp) between the power terminal Td1 and the step-up output terminal TOUTp, capacitors Cp1 through Cp3 connected between the step-up clock terminals TPcka and TPckb and the cathodes of the diodes Dp1 through Dp3, respectively. That is, Cp1 is connected between Tpcka and a point between Dp1 and Dp2; Cp2 is connected between Tpckb and a point between Dp2 and Dp3; Cp3 is connected between Tpcka and a point between Dp3 and Dp4. A capacitor Cp4 is connected between the ground terminal TGND and the cathode of the diode Dp4.

As shown in FIG. 5, the charge pump Cx, for example, further includes diodes Dn1 through Dn4 and a resistor Rn connected in series (in sequence from ground terminal TGND: Dn1, Dn2, Dn3, Dn4, and Rn) between the ground terminal TGND and the step-down output terminal TOUTn, capacitors Cn1 through Cn3 connected between the step-down clock terminals TNcka and TNckb and the cathodes of the diodes Dn1 through Dn3, respectively. That is, Cn1 is connected between TNcka and a point between Dn1 and Dn2; Cn2 is connected between TNckb and a point between Dn2 and Dn3; Cn3 is connected between TNcka and a point between Dn4. A capacitor Cn4 is connected between the ground terminal TGND and the anode of the diode Dn4.

As noted above, the output current from the step-up buffer circuit BCP for the step-up clock signals Pcka and Pckb increases in accordance with the step-up boost signal Pbst, for example. When the current level (driving capability) of step-up clock signals Pcka and Pckb increases, the time for charging the capacitors Cp1 through Cp3 decreases. Accordingly, the output current of the charge pump Cx increases.

When the output current of the step-up buffer circuit BCP for the step-up clock signals Pcka and Pckb increases in accordance with the step-up boost signal Pbst, the charge pump Cx rapidly raises the step-up voltage Vp.

Similarly, when the output current of the step-down buffer circuit BCN for the step-down clock signal Ncka and Nckb increases in accordance with the step-down boost signal Nbst, the charge pump Cx rapidly lowers the step-down voltage Vn.

On the other hand, when the driving capability (output current) of the step-up buffer circuit BCP for the step-up clock signals Pcka and Pckb decreases (e.g., when the step-up boost signal Pbst indicates that the level of the step-up voltage Vp is equal to or higher than the step-up threshold), the time for charging the capacitors Cp1 through Cp3 increases. Accordingly, the output current of the charge pump Cx decreases.

Namely, when the output current of the step-up buffer circuit BCP for the step-up clock signals Pcka and Pckb decreases in accordance with the step-up boost signal Pbst, the charge pump Cx lowers the step-up voltage Vp.

Similarly, when the output current of the step-down buffer circuit BCN for the step-down clock signal Ncka and Nckb decreases in accordance with the step-down boost signal Nbst, the charge pump Cx raises the step-down voltage Vn.

Accordingly, the regulator Re in this embodiment is configured so as to vary the clock signals from the clock generating circuit Ro in accordance with the step-up boost signal Pbst and the step-down boost signal Nbst by controlling the driving currents supplied to the step-up buffer circuit BCP and the step-down buffer circuit BCN to thereby regulate the output of step-up voltage Vp and step-down voltage Vn according to predetermined threshold values.

According to this structure, the driving current of the clock generating circuit Ro is adjusted when the step-up voltage Vp and the step-down voltage Vn reach constant values. As a result, the step-up and step-down capability of the charge pump Cx is automatically adjusted to the level for maintaining the constant condition. In this case, only the necessary driving current flows in the step-up buffer circuit BCP and the step-down buffer circuit BCN of the clock generating circuit Ro after circuits BCP and BCN come to steady state, thus the flow of unnecessary current decreases. In other words, the overall consumption current of the regulator Re can be decreased.

Figure 6:
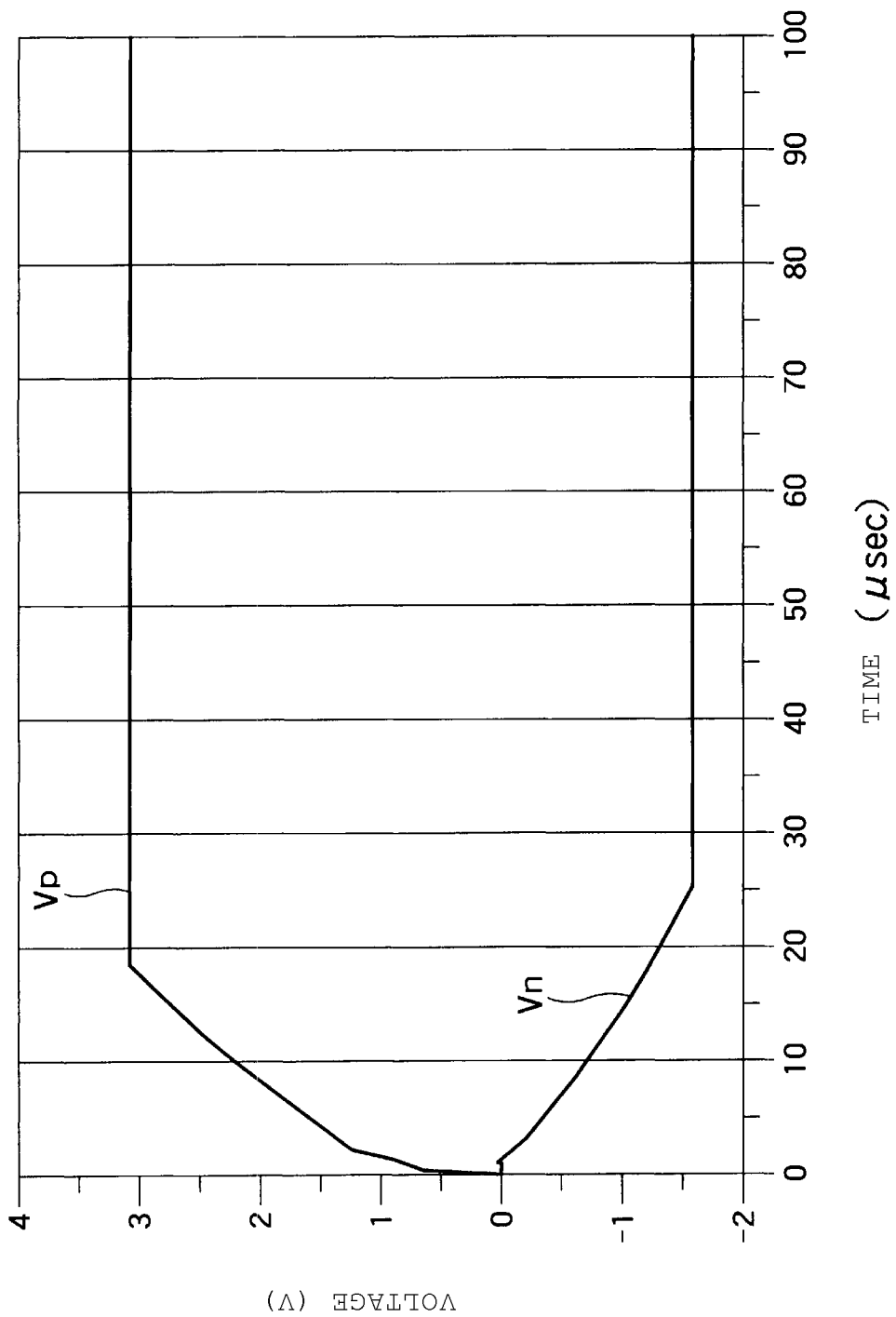
FIG. 6 shows a waveform representing the relationship between time and a step-up voltage and a step-down voltage after supply of an external source voltage in the regulator shown in FIG. 2.

FIG. 6 shows a waveform representing the relationship between time and the step-up voltage Vp and the step-down voltage Vn after initial (t=0) supply of the external source voltage Vdd to the regulator Re in FIG. 2.

Figure 7:
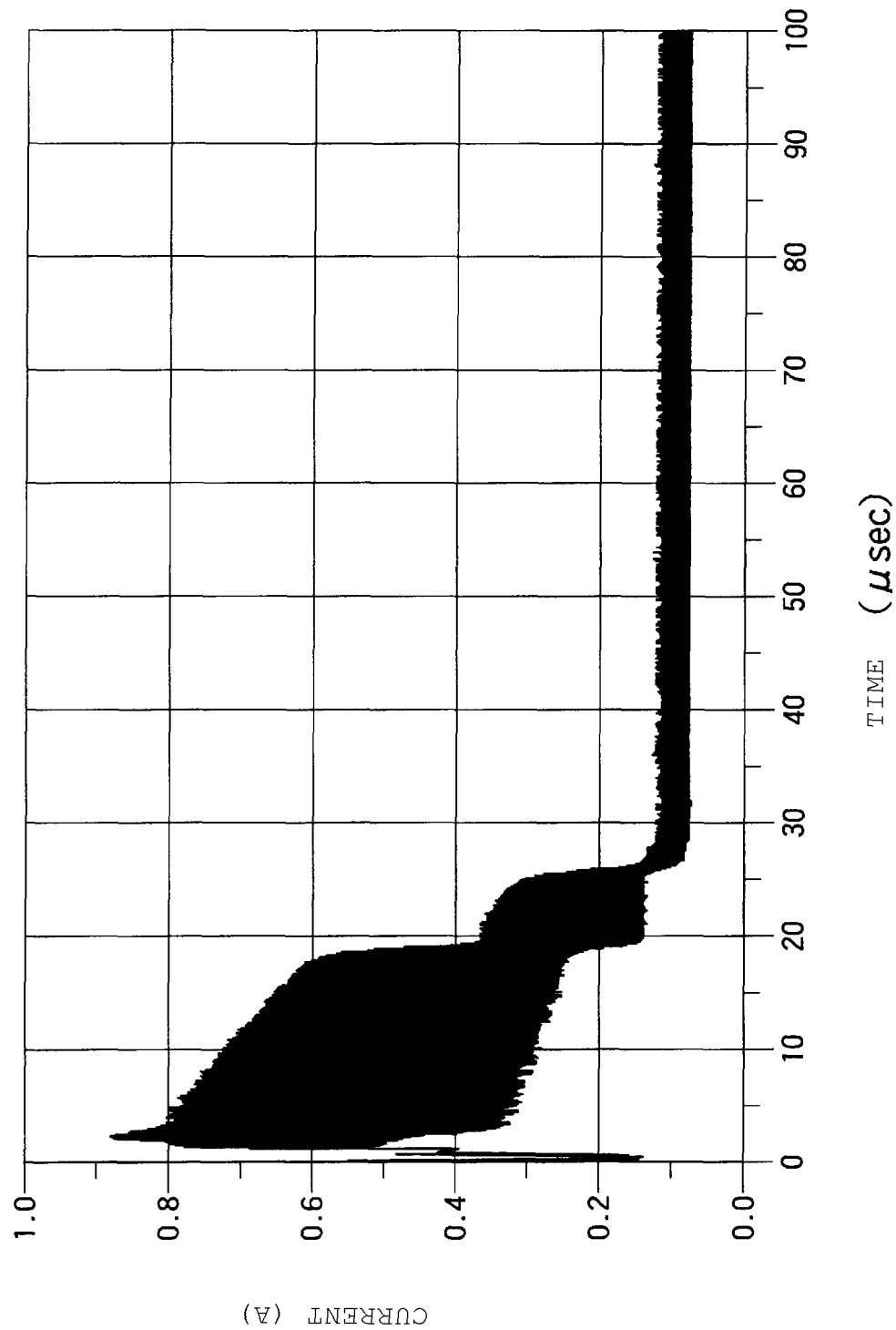
FIG. 7 shows a waveform representing the relationship between time and current flowing in an external power terminal after supply of the external source voltage in the switch device shown in FIG. 1.

FIG. 7 shows a waveform representing an example of the relationship between time and current flowing in the external power terminal TVdd after supply of the external source voltage Vdd in the switch device 100 shown in FIG. 1.

As shown in FIG. 6, the step-up voltage Vp reaches a constant value at an elapsed time around 20 µs from initial supply of the external source voltage Vdd, while the step-down voltage Vn reaches a constant value at an elapsed time around 25 µs from initial supply of the external source voltage Vdd.

As shown in FIG. 7, the consumption current lowers when the step-up voltage Vp reaches the constant value (elapsed time around 20 µs from supply of the external source voltage Vdd). The consumption current further lowers when the step-down voltage Vn reaches the constant value (elapsed time around 25 µs from supply of the external source voltage Vdd).

According to the regulator Re in this embodiment, therefore, the consumption current is reduced while maintaining the switching performance at the time of power start or changeover.

Accordingly, the regulator in this embodiment can reduce consumption of current.

Second Embodiment

A second embodiment discussed herein is associated with a structure example of a regulator which includes a configuration for changing the frequency of the oscillation signal generated from the oscillator of the clock generating circuit and otherwise is similar to the structure of the first embodiment.

Figure 8:
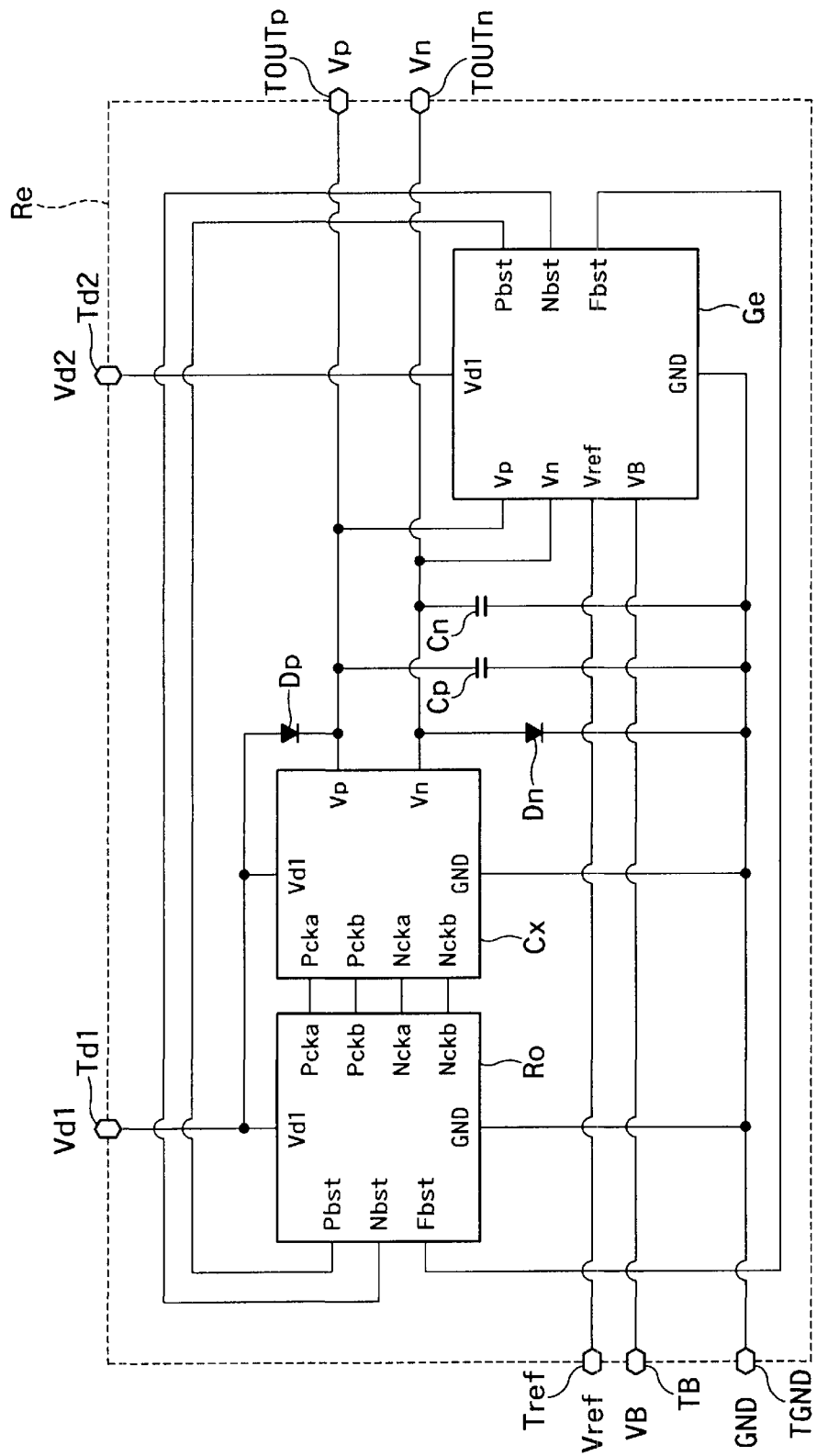
FIG. 8 is a block diagram showing a structure example of the regulator according to a second embodiment.

FIG. 8 is a block diagram showing an example structure of the regulator Re according to the second embodiment.

Figure 9:
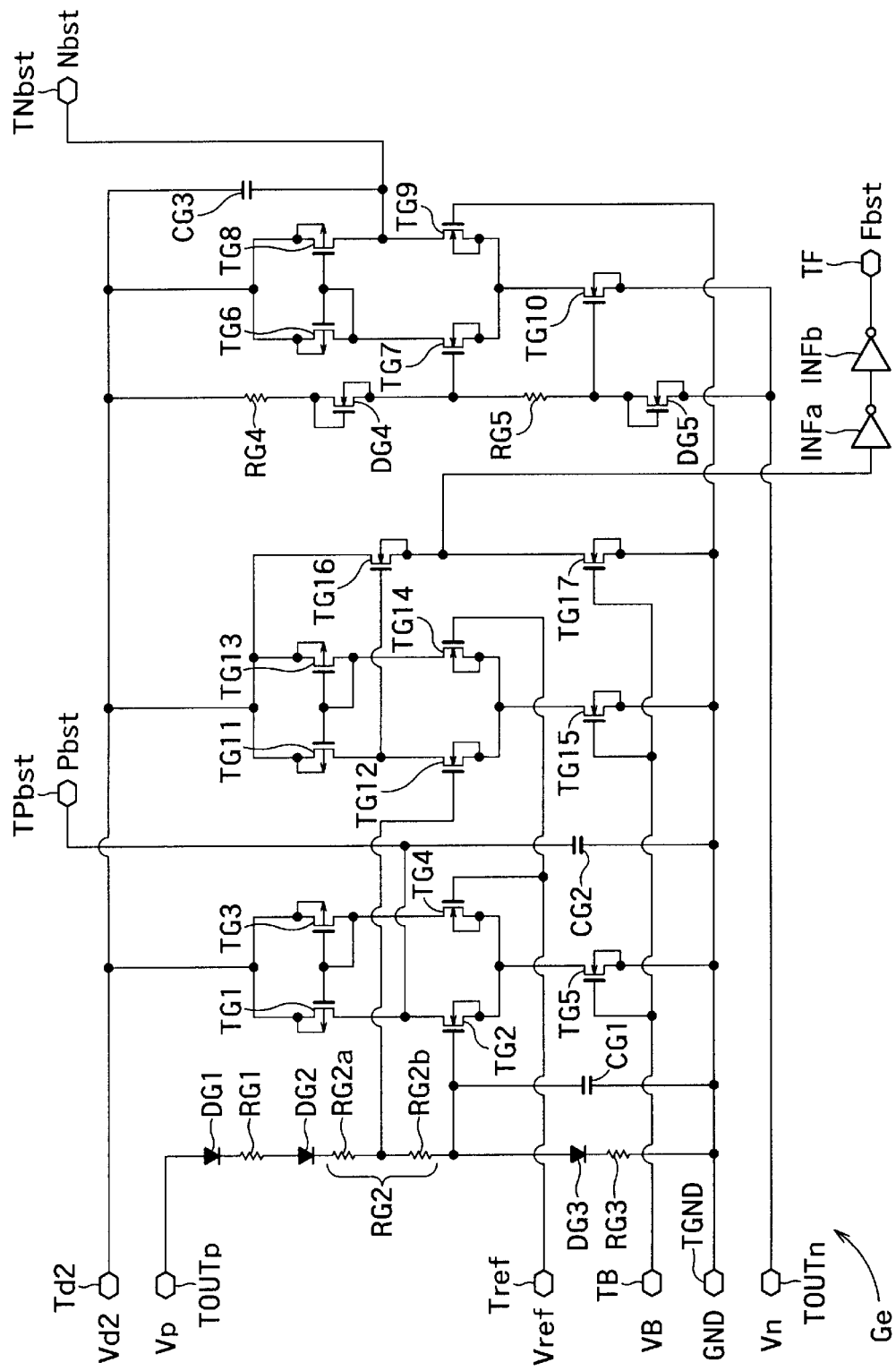
FIG. 9 is a circuit diagram showing a structure example of a feedback circuit shown in FIG. 8.

FIG. 9 is a circuit diagram showing a structure example of the feedback circuit Ge depicted in FIG. 8.

Figure 10:
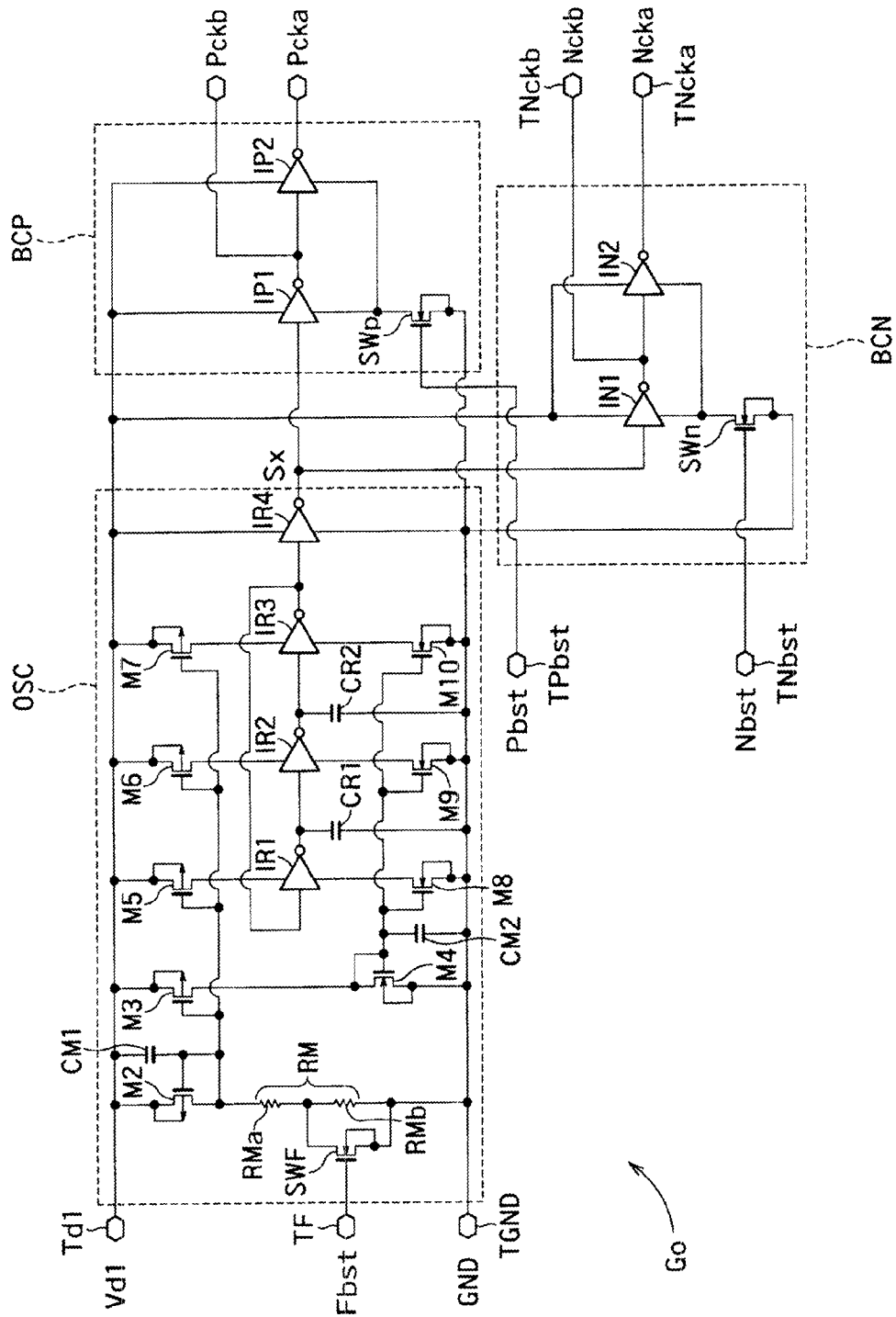
FIG. 10 is a circuit diagram showing a structure example of a clock generating circuit shown in FIG. 8.

FIG. 10 is a circuit diagram showing a structure example of the clock generating circuit Ro depicted in FIG. 8. The components in FIGS. 8 through 10 that are similar to the components in the first embodiment are given reference numbers corresponding to components depicted in FIGS. 2 through 4.

As shown in FIG. 8, the regulator Re includes the power terminal Td1, the power terminal Td2, the step-up output terminal TOUTp, the step-down output terminal TOUTn, the ground terminal TGND, the step-up diode Dp, the step-up capacitor Cp, the step-down diode Dn, the step-down capacitor Cn, the feedback circuit Ge, the clock generating circuit Ro, and the charge pump Cx, for example. The regulator Re shown in FIG. 8 can be incorporated in the switch device 100 shown in FIG. 1 similarly to the regulator Re shown in FIG. 2.

The charge pump Cx according to this embodiment can have a structure similar to the corresponding structure of the first embodiment, for example.

The feedback circuit Ge in the second embodiment outputs a frequency boost signal Fbst to a frequency boost terminal TF in accordance with the comparison result between the step-up voltage Vp and a (frequency) boost threshold value.

As shown in FIG. 9, the feedback circuit Ge includes: a third comparator including MOS transistors TG11 through TG15 and comparing a divided voltage based on the step-up output voltage Vp to the reference voltage Vref and outputting the comparison result; an output circuit including MOS transistors TG16 and TG17 connected in series between the power terminal Td2 and the ground terminal TGND that outputs a signal Sy based the comparison result generated by the third comparator; and inverters INFa and INFb receiving the signal Sy and outputting the frequency boost signal Fbst to the frequency boost terminal TF, for example. The voltage at a connection point between resistor RG2a and resistor RG2b, which collectively correspond to resistor RG2, is used as the divided voltage based on the step-up output voltage Vp that is supplied to the third comparator.

Accordingly, the feedback circuit Ge shown in FIG. 9 compares a divided voltage based on the step-up output voltage Vp and the reference voltage Vref so as to indirectly compare the step-up voltage Vp to the boost threshold, and then outputs the frequency boost signal Fbst in accordance with the result of the comparison.

The oscillator OSC of the clock generating circuit Ro changes the oscillation frequency of the oscillation signal Sx according to the frequency boost signal Fbst.

For example, when the frequency boost signal Fbst indicates that the level of the step-up voltage Vp is lower than the frequency boost threshold, the oscillator OSC increases the oscillation frequency of the oscillation signal Sx—this causes the frequencies of the step-up clock signals Pcka and Pckb to increase. As a result, the step-up capability of the charge pump Cx rises and the step-up voltage Vp increases.

On the other hand, when the frequency boost signal Fbst indicates that the level of the step-up voltage Vp is equal to or higher than the frequency boost threshold, the oscillator OSC decreases the oscillation frequency of the oscillation signal Sx. In this case, the frequencies of the step-up clock signals Pcka and Pckb decrease. As a result, the step-up capability of the charge pump Cx lowers and the step-up voltage Vp decreases.

As shown in FIG. 10, the oscillator OSC further includes an MOS transistor SWF, for example. The drain of the MOS transistor SWF connects with a connection point between the resistor RMa and the resistor RMb collectively forming the resistor RM. The source of the MOS transistor SWF connects with the ground terminal TGND. The frequency boost signal Fbst is inputted to the gate of the MOS transistor SWF.

The channel conductivity of MOS transistor SWF is controlled in accordance with the frequency boost signal Fbst. As a result, the current flowing in a resistor RM is controlled, by which the mirror current (the driving current supplied to the inverters IR1 through IR3) flowing in the MOS transistors M5 through M7 constituting a mirror circuit is controlled.

For example, when the frequency boost signal Fbst indicates that the level of the step-up voltage Vp is lower than the frequency boost threshold, the MOS transistor SWF is turned on and the driving current increases.

On the other hand, when the frequency boost signal Fbst indicates that the level of the step-up voltage Vp is equal to or higher than the frequency boost threshold, the MOS transistor SWF is turned off and the driving current decreases.

Accordingly, the driving current supplied to the inverters IR1 through IR3 is controlled by the frequency boost signal Fbst and oscillation frequency of the oscillation signal Sx outputted from the oscillator OSC is controlled.

This embodiment can reduce the oscillation frequency during the steady state operation to a minimal frequency required to maintaining the switch condition. Accordingly, the consumption current can further decrease.

Other structures and functions of the regulator Re are similar to those of the regulator Re shown in the first embodiment. Accordingly, the regulator in this embodiment can achieve reduction of the consumption current.

While certain embodiments have been described, these embodiments have been presented by way of example only, and are not intended to limit the scope of the disclosure. Indeed, the embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the disclosure.

What is claimed is:

1. A regulator, comprising:
   a first capacitor connected between a ground terminal and a first output terminal from which a first voltage is supplied;
   a feedback circuit configured to output a first boost signal corresponding to a comparison between the first voltage and a first threshold voltage;
   a clock generating circuit including a first buffer circuit configured to output a first clock signal at an electric current level that is controlled in accordance with the first boost signal; and
   a charge pump configured to generate the first voltage from a first power source voltage in accordance with the first clock signal, the first voltage being a negative voltage, wherein
   the first buffer circuit comprises:
      a first inverter configured to output the first clock signal; and
      a first control switch configured to control a driving current supplied to the first inverter, the driving current controlled in accordance with the first boost signal.

2. The regulator according to claim 1, wherein
   the charge pump decreases the first voltage when the electric current level of the first clock signal rises, and increases the first voltage when the electric current level of the first clock signal falls.

3. The regulator according to claim 1, wherein the first control switch is a MOS transistor and the first boost signal is supplied to a gate of the MOS transistor.

4. The regulator according to claim 1, wherein
   the clock generating circuit further comprises an oscillation circuit for generating an oscillation signal and the first buffer circuit outputs the first clock signal according to the oscillation signal,
   the charge pump circuit is configured to generate a second voltage from the first power source voltage in accordance with a second clock signal, the second voltage is higher than the first power source voltage, and
   the feedback circuit is configured to output a second boost signal corresponding to a comparison between a second threshold voltage and the second voltage and to output a frequency boost signal corresponding to a comparison between the second voltage and a frequency boost threshold voltage value, and the oscillator circuit is configured to vary an oscillation frequency of the oscillation signal in accordance with the frequency boost signal.

5. The regulator according to claim 4, wherein the oscillator circuit is configured to increase the oscillation frequency when the frequency boost signal indicates the second voltage is lower than the frequency boost threshold voltage value, and to decrease the oscillation frequency when the frequency boost signal indicates the second voltage is equal to or higher than to the frequency boost threshold voltage value.

6. A switch device, comprising:
   a voltage stabilizer configured to generate and output a first power source voltage, a reference voltage, and a control voltage from an external source voltage;
   a regulator according to claim 1;
   a decoder configured to receive an input signal, decode the input sign, and output switch control signals generated from the first voltage; and
   a switch circuit including a plurality of switch elements that are configured to be controlled by the switch control signals.

7. The switch device according to claim 6, wherein
   the charge pump decreases the first voltage when the electric current level of the first clock signal rises, and increases the first voltage when the electric current level of the first clock signal falls.

8. The switch device according to claim 6, wherein the clock generating circuit further comprises an oscillation circuit for generating an oscillation signal and the first buffer circuit outputs the first clock signal according to the oscillation signal.

9. The switch device according to claim 8, wherein
   the charge pump circuit is configured to generate a second voltage from the first power source voltage in accordance with a second clock signal, the second voltage being higher than the first power source voltage, and
   the feedback circuit is further configured to output a frequency boost signal corresponding to a comparison between the second voltage and a frequency boost threshold voltage, and
   the oscillator circuit is configured to vary an oscillation frequency of the oscillation signal in accordance with the frequency boost signal.

10. The regulator according to claim 1, wherein the feedback circuit comprises a differential amplifier circuit configured to output the first boost signal corresponding to a comparison between the first threshold voltage and a divided voltage which is between the first voltage and a power supply voltage, the first boost signal is a common mode voltage to the divided voltage.

11. A regulator, comprising:
   a first capacitor connected between a ground terminal and a first output terminal from which a first voltage is supplied;
   a feedback circuit configured to output a first boost signal corresponding to a comparison between the first voltage and a first threshold voltage;
   a clock generating circuit including an oscillator circuit configured to output an oscillation signal, and a first buffer circuit configured to output a first clock signal according to the oscillation signal, the first clock signal having an electric current level that is controlled in accordance with the first boost signal; and a charge pump configured to generate the first voltage from a ground voltage in accordance with the first clock signal, the first voltage being a negative voltage, wherein the first buffer circuit comprises:
   a first inverter configured to receive a signal corresponding to the oscillation signal and to output the first clock signal; and
   a first control switch configured to control a driving current supplied to the first inverter, the driving current controlled in accordance with the first boost signal.

12. The regulator according to claim 11, wherein the charge pump decreases the first voltage when the electric current level of the first clock signal rises, and increases the first voltage when the electric current level of the first clock signal falls.

* * * * *